US008786320B2

(12) United States Patent
Koo

(10) Patent No.: US 8,786,320 B2
(45) Date of Patent: Jul. 22, 2014

(54) SIGNAL INPUT CIRCUIT AND SEMICONDUCTOR DEVICE HAVING THE SAME

(75) Inventor: Kyunghoi Koo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 167 days.

(21) Appl. No.: 12/846,230

(22) Filed: Jul. 29, 2010

(65) Prior Publication Data

US 2011/0074484 A1 Mar. 31, 2011

(30) Foreign Application Priority Data

Sep. 28, 2009 (KR) .................... 10-2009-0091930

(51) Int. Cl.
*H03K 3/00* (2006.01)

(52) U.S. Cl.
USPC ........................................ 327/108

(58) Field of Classification Search
None
See application file for complete search history.

(56) References Cited

U.S. PATENT DOCUMENTS

| 4,691,127 | A | 9/1987 | Huizer | |
|---|---|---|---|---|
| 6,252,432 | B1 * | 6/2001 | Freitas | 327/65 |
| 7,005,889 | B2 * | 2/2006 | Sowden et al. | 326/81 |
| 7,088,152 | B2 | 8/2006 | Kim | |
| 7,091,741 | B2 | 8/2006 | Kim | |
| 7,091,755 | B1 * | 8/2006 | Zhou et al. | 327/108 |
| 7,498,847 | B2 | 3/2009 | Park | |
| 7,564,270 | B1 * | 7/2009 | Zhang et al. | 326/127 |
| 7,880,521 | B2 * | 2/2011 | Okamura et al. | 327/170 |
| 7,961,007 | B2 * | 6/2011 | Scott et al. | 326/86 |
| 8,035,415 | B2 | 10/2011 | Osame et al. | |
| 2005/0046472 | A1 * | 3/2005 | Kim | 327/562 |
| 2005/0068067 | A1 | 3/2005 | Kim | |
| 2007/0176638 | A1 | 8/2007 | Park | |
| 2008/0273004 | A1 | 11/2008 | Osame et al. | |
| 2010/0034338 | A1 | 2/2010 | Osame et al. | |
| 2011/0068824 | A1 | 3/2011 | Osame et al. | |
| 2012/0019300 | A1 | 1/2012 | Osame et al. | |

FOREIGN PATENT DOCUMENTS

| CN | 1969341 | 5/2007 |
|---|---|---|
| JP | 61137421 | 6/1986 |
| JP | 2005-73269 | 3/2005 |
| JP | 2005-102217 | 4/2005 |
| JP | 2007-325156 | 12/2007 |
| KR | 10-0510548 | 8/2005 |
| KR | 10-0715392 | 4/2007 |

* cited by examiner

*Primary Examiner* — Lincoln Donovan
*Assistant Examiner* — Khareem E Almo
(74) *Attorney, Agent, or Firm* — Onello & Mello, LLP

(57) ABSTRACT

A signal input circuit includes an input unit, a first compensation circuit, a second compensation circuit, and an enable circuit. The input unit receives a first input signal to output an output signal to an output node. The first compensation circuit is connected to the output node and discharges the output node in response to a second input signal. The second compensation circuit is connected to the output node and supplies a current to the output node in response to the second input signal. The enable circuit enables the input unit and the first and second compensation circuits in response to at least one operation mode selection signal.

19 Claims, 6 Drawing Sheets

SIGNAL INPUT CIRCUIT AND SEMICONDUCTOR DEVICE HAVING THE SAME

CROSS-REFERENCE TO RELATED APPLICATIONS

This U.S. non-provisional patent application claims priority under 35 U.S.C. §119 of Korean Patent Application No. 10-2009-0091930, filed in the Korean Intellectual Property Office on Sep. 28, 2009, the entire contents of which are hereby incorporated by reference.

BACKGROUND

The present inventive concept relates to a signal input circuit included in a semiconductor device.

A signal input circuit that is connected to the input unit of a device may be implemented with a differential input circuit or a single-ended input circuit according to requirements. The single-ended input circuit is a circuit structure in which an input signal is applied or an output signal is outputted through only the one end of a pair of ports in an electric circuit. The differential input circuit has a circuit structure in which an input signal is applied or an output signal is outputted through the both ends of a pair of ports. The differential input circuit may be designed to have a scheme of amplifying and outputting the voltage difference between two complementary signals or a scheme of amplifying and outputting the difference between an input signal and a reference signal.

A signal input circuit should be configured with one of the differential input signal and the single-ended input circuit according to the transmission scheme of a circuit for transmitting a data signal. If the signal input circuit is designed so as to receive a differential signal and a single signal, the range of applications of the signal input circuit may become larger.

SUMMARY

The present disclosure provides a signal input circuit, which has a simple circuit configuration and can receive a differential signal and a single signal.

According to one aspect, the inventive concept is directed to a signal input circuit including: an input unit receiving a first input signal to output an output signal to an output node; a first compensation circuit connected to the output node, discharging the output node in response to a second input signal; a second compensation circuit connected to the output node, supplying a current to the output node in response to the second input signal; and an enable circuit enabling the input unit and the first and second compensation circuits in response to at least one operation mode selection signal.

In some embodiments, the input unit may include: a PMOS transistor connected between a power source voltage terminal and the output node, and controlled by the first input signal; and an NMOS transistor connected between the output node and the enable circuit, and controlled by the first input signal.

In some embodiments, the first compensation circuit may include: a PMOS transistor connected between a power source voltage terminal and a first node, and controlled by the second input signal; a first NMOS transistor connected between the first node and the enable circuit, and controlled by a signal of the first node; and a second NMOS transistor connected between the output node and the enable circuit, and controlled by the signal of the first node.

In some embodiments, the second compensation circuit may include: a first PMOS transistor connected between a power source voltage terminal and the output node, and controlled by a signal of a second node; a second PMOS transistor connected between the power source voltage terminal and the second node, and controlled by the signal of the second node; and an NMOS transistor connected between the second node and the enable circuit, and controlled by the second input signal.

In some embodiments, the first and second input signals may be inverted therebetween.

In some embodiments, the enable circuit may receive first and second operation mode selection signals, enable the first and second compensation circuits in response to the first operation mode selection signal, and enable the input unit in response to the second operation mode selection signal.

According to another aspect, the inventive concept is directed to a signal input circuit which includes: an input unit receiving a first input signal to output an output signal to an output node; a first compensation circuit connected to the output node, discharging the output node in response to a second input signal; a second compensation circuit connected to the output node, supplying a current to the output node in response to the second input signal; and a switching circuit respectively connected to the input unit, the first compensation circuit and the second compensation circuit through first to third connection nodes, connecting the first to third connection nodes to a ground voltage terminal in response to at least one operation mode selection signal.

In some embodiments, the input unit comprises: a PMOS transistor connected between a power source voltage terminal and the output node, and controlled by the first input signal; and an NMOS transistor connected between the output node and the switching circuit, and controlled by the first input signal.

In some embodiments, the first compensation circuit comprises: a PMOS transistor connected between a power source voltage terminal and a first node, and controlled by the second input signal; a first NMOS transistor connected between the first node and the first connection node of the switching circuit, and controlled by a signal of the first node; and a second NMOS transistor connected between the output node and the first connection node of the switching circuit, and controlled by the signal of the first node.

In some embodiments, the second compensation circuit comprises: a first PMOS transistor connected between a power source voltage terminal and the output node, and controlled by a signal of the second node; a second PMOS transistor connected between the power source voltage terminal and the second node, and controlled by the signal of the second node; and an NMOS transistor connected between the second node and the second connection node of the switching circuit, and controlled by the second input signal.

In some embodiments, the first and second input signals are inverted therebetween.

In some embodiments, the switching circuit receives first and second operation mode selection signals, connects the second and third connection nodes which are respectively connected to the first and second compensation circuits to the ground voltage terminal, and connects the first connection node connected to the input unit to the ground voltage terminal in response to the second operation mode selection signal.

In some embodiments, the switching circuit comprises: a first NMOS transistor connected between the ground voltage terminal and the first connection node which is connected to the input unit, and controlled by the first operation mode selection signal; a second NMOS transistor connected between the ground voltage terminal and the second connection node which is connected to the first compensation circuit, and controlled by the second operation mode selection signal; and a third NMOS transistor connected between the ground voltage terminal and the third connection node which is connected to the second compensation circuit, and controlled by the second operation mode selection signal.

According to another aspect, the inventive concept is directed to a signal input circuit which includes: a PMOS transistor connected between a power source voltage terminal and an output node, and controlled by a first input signal; an NMOS transistor connected between the output node and a switching circuit, and controlled by the first input signal; a first compensation circuit connected to the output node, compensating an operation delay of the PMOS transistor in response to a second input signal; a second compensation circuit connected to the output node, compensating an operation delay of the NMOS transistor in response to the second input signal; and an enable circuit enabling the PMOS transistor, the NMOS transistor and the first and second compensation circuits in response to at least one operation mode selection signal.

In some embodiments, the first and second input signals may be inverted therebetween.

In some embodiments, the first compensation circuit discharges the output node when the second input signal has a first level, and the second compensation circuit supplies a current to the output node when the second input signal has a second level.

According to another aspect, the inventive concept is directed to a semiconductor device which includes: a first circuit; and a second circuit receiving a data signal from the first circuit, and including a signal input circuit for receiving the data signal from the first circuit, wherein the signal input circuit includes: an input unit receiving a first input signal to output an output signal to an output node; a first compensation circuit connected to the output node, discharging the output node in response to a second input signal; a second compensation circuit connected to the output node, supplying a current to the output node in response to the second input signal; and an enable circuit enabling the input unit and the first and second compensation circuits in response to at least one operation mode selection signal.

In some embodiments, the first and second input signals are inverted therebetween, and the enable circuit receives first and second operation mode selection signals, enables the first and second compensation circuits in response to the first operation mode selection signal, and enables the input unit in response to the second operation mode selection signal.

In some embodiments, the first compensation circuit comprises: a PMOS transistor connected between a power source voltage terminal and a first node, and controlled by the second input signal; a first NMOS transistor connected between the first node and the first connection node of the switching circuit, and controlled by a signal of the first node; and a second NMOS transistor connected between the output node and the first connection node of the switching circuit, and controlled by the signal of the first node, and the second compensation circuit comprises: a first PMOS transistor connected between a power source voltage terminal and the output node, and controlled by a signal of the second node; a second PMOS transistor connected between the power source voltage terminal and the second node, and controlled by the signal of the second node; and an NMOS transistor connected between the second node and the second connection node of the switching circuit, and controlled by the second input signal.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to describe the inventive concept.

DETAILED DESCRIPTION OF THE EMBODIMENTS

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this description will be thorough and complete, and will fully convey the inventive concept to those skilled in the art.

Hereinafter, exemplary embodiments of the inventive concept will be described in detail with reference to the accompanying drawings.

Figure 1:
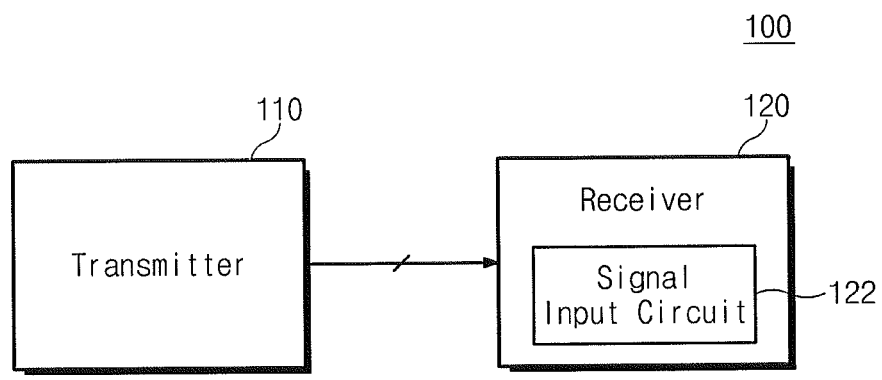
FIG. 1 is a diagram illustrating a signal transmission system according to an embodiment of the inventive concept.

FIG. 1 is a diagram illustrating a signal transmission system according to an embodiment of the inventive concept.

Referring to FIG. 1, a signal transmission system 100 according to an embodiment of the inventive concept includes a transmitter 110 and a receiver 120. A signal that is transmitted from the transmitter 110 to the receiver 120 may be a differential signal or a single or single-ended signal. When the signal that is transmitted from the transmitter 110 to the receiver 120 is a differential signal, the receiver 120 receives a pair of transmission signals that are transmitted from the transmitter 110, senses a voltage difference between the pair of transmission signals, and operates in a pseudo differential input mode or a differential input mode for restoring the received signal. When the signal that is transmitted from the transmitter 110 to the receiver 120 is a single signal, the receiver 120 operates in a single input mode for restoring a transmission signal transmitted from the transmitter 110 into a reception signal. In this way, the receiver 120 includes a signal input circuit 122 that receives the differential signal and the single signal to restore the received signals into a reception signal.

The operation mode of the receiver 120 is determined according to the signal transmission mode of the transmitter 110 that is connected to the receiver 120. For example, if the transmitter 110 operates in a single transmission mode such as a mobile double data rate synchronous dynamic random access memory (mDDR) or a CMOS interface, the receiver 120 is set in a single input mode. If the transmitter 110 operates in a pseudo differential transmission mode such as a double data rate three synchronous DRAM (DDR3), the receiver 120 is set in a differential mode and thereby operates in a pseudo differential mode. If the transmitter 110 operates in a differential transmission mode such as low power double data rate synchronous DRAM (LPDDR2), low voltage differential signaling (LVDS) or serial advanced technology attachment (S-ATA), the receiver 120 is set in a differential mode.

Figure 2:
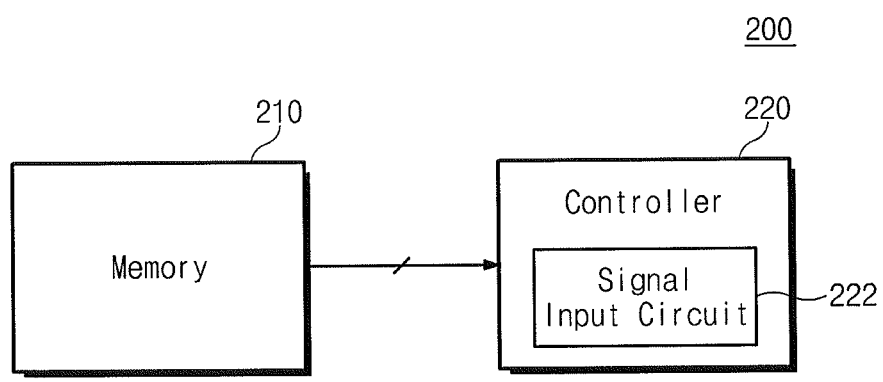
FIG. 2 is a block diagram illustrating a memory system according to an embodiment of the inventive concept.

FIG. 2 is a block diagram illustrating a memory system according to an embodiment of the inventive concept.

Referring to FIG. 2, a memory system 200 according to an embodiment of the inventive concept includes a memory 210 and a controller 220. The controller 220 is connected to a host (not shown) and the memory 210. The controller 220 accesses the memory 210 in response to the request of the host. For example, the controller 220 controls the reading, writing and erasing operations of the memory 210. The controller 220 provides an interface between the memory 210 and the host. The controller 220 drives firmware for controlling the memory 210. The controller 220 includes a protocol for performing data exchange between the host and the controller 220. For example, the controller 220 communicates with the outside (for example, the host) according to at least one of various interface protocols such as a Universal Serial Bus (USB) protocol, a Multimedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol and Integrated Drive Electronics (IDE) protocol. The controller 220 interfaces with the memory 210. The controller 220 includes a signal input circuit 222 for receiving a signal that is transmitted from the memory 210. The memory system 200 according to an embodiment of the inventive concept illustrates and describes that the controller 220 includes only the signal input circuit 222 for receiving a signal that is transmitted from the memory 210, but the controller 220 may also include a signal input circuit for receiving a signal that is transmitted from the host. Likewise with the signal input circuit 122 of FIG. 1, the signal input circuit 222 operates in a single input mode, a differential input mode and a pseudo differential mode according to the transmission mode of the transmitter 110. The signal input circuit 222 according to an embodiment of the inventive concept will be described in more detail with reference to FIG. 3.

The memory 210 includes a memory cell array storing data, a reading and writing circuit for writing data in the memory cell array and reading data from the memory cell array, an address decoder decoding an external address to transfer the decoded address to the reading and writing circuit, and a control logic controlling the overall operation of the memory 210 (which may be a nonvolatile memory).

Figure 3:
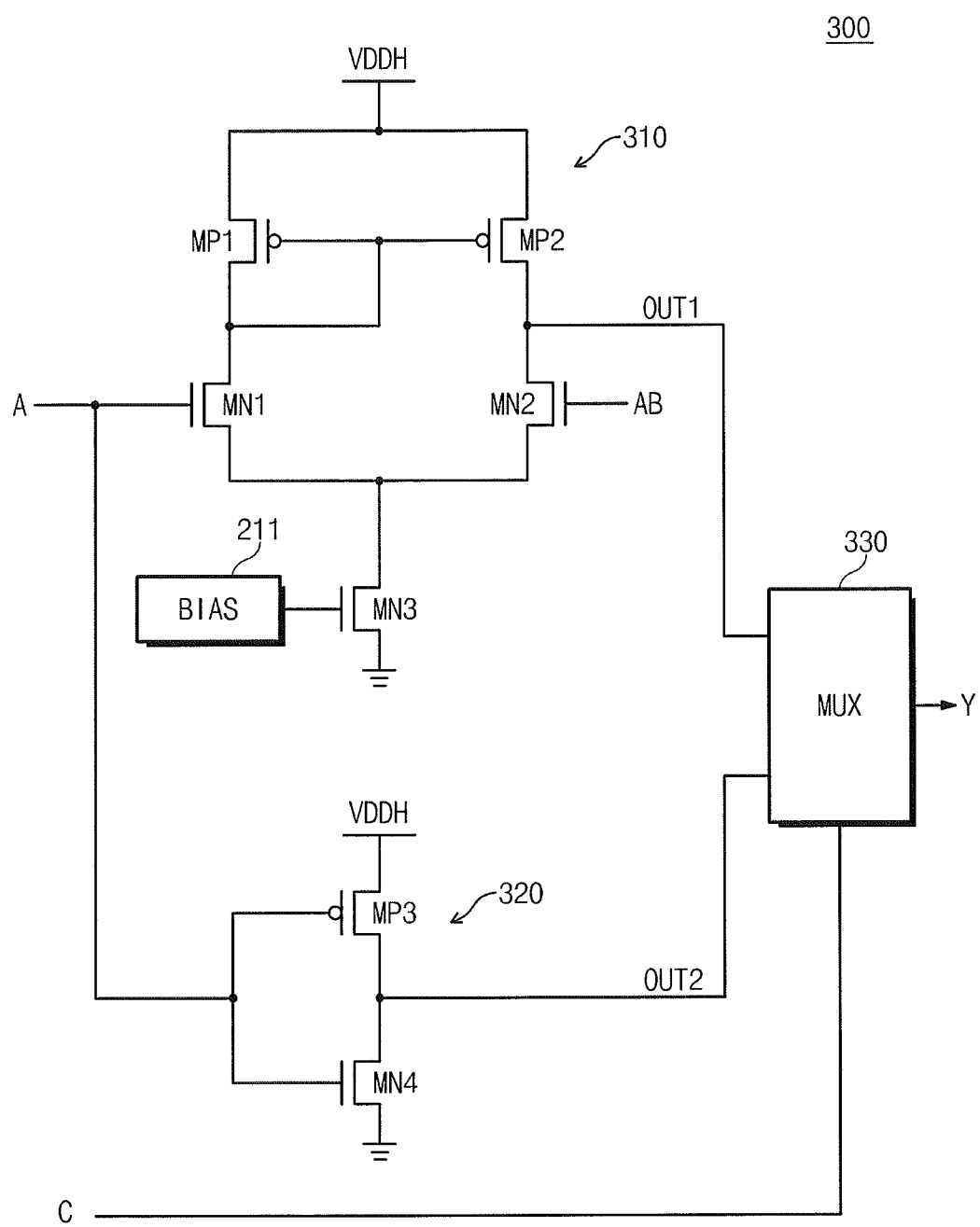
FIG. 3 is a diagram illustrating the configuration of a signal input device which may be included in the receiver of FIG. 1 and the controller of FIG. 2, according to an embodiment of the inventive concept.

FIG. 3 is a diagram illustrating the configuration of a signal input device which may be included in the receiver of FIG. 1 and the controller of FIG. 2, according to an embodiment of the inventive concept.

Referring to FIG. 3, a signal input circuit 300 according to an embodiment of the inventive concept includes a differential amplifier 310, an inverter 320, and a multiplexer 330. The differential amplifier 310 receives a first input signal A and a second input signal AB to output a first output signal OUT1. The inverter 320 receives the first input signal A to output a second output signal OUT2. The multiplexer 330 outputs one of the first output signal OUT1 from the differential amplifier 310 and the second output signal OUT2 from the inverter 320 as an output signal Y, in response to a mode selection signal C.

The differential amplifier 310 includes PMOS transistors MP1 and MP2, NMOS transistors MN1 to MN3, and a bias circuit 211. The PMOS transistor MP1 has a source connected to a power source voltage VDDH terminal, a drain and a gate. The drain and gate of the PMOS transistor are connected to each other. The NMOS transistor MN1 has a drain connected to the drain of the PMOS transistor MP1, a source, and a gate receiving the first input signal A. The PMOS transistor MP2 has a source connected to the power source voltage VDDH terminal, a drain, and a gate connected to the drain of the PMOS transistor MP1. The NMOS transistor MN2 has a drain connected to the drain of the PMOS transistor MP2, a source, and a gate receiving the second input signal AB. The NMOS transistor MN3 has a drain connected to the sources of the NMOS transistors MN1 and MN2 in common, a source connected to a ground voltage terminal and a gate connected to the bias circuit 211. The bias circuit 211 outputs a signal for controlling a current that flows through the NMOS transistor MN3. The differential amplifier 310 having the above-described configuration amplifies a difference between the first input signal A and the second input signal AB to output the first output signal OUT1.

The inverter 320 includes a PMOS transistor MP3 and an NMOS transistor MN4 that are sequentially connected in series between the power source voltage VDDH terminal and the ground voltage terminal. The gate of the PMOS transistor MP3 and the gate of the NMOS transistor MN4 receive the first input signal A. The inverter 320 inverts the first input signal A to output the second output signal OUT2.

The multiplexer 330 outputs the first output signal OUT1 from the differential amplifier 310 as the output signal Y when the mode selection signal C has a first level, and outputs the second output signal OUT2 from the inverter 320 as the output signal Y when the mode selection signal C has a second level.

Figure 4A:
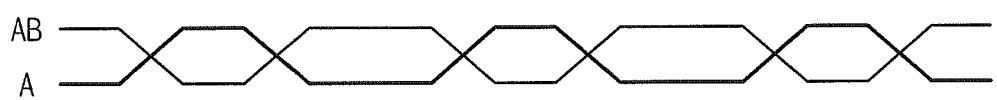
FIGS. 4A and 4B are diagrams first and second input signals which are inputted to the signal input circuit of FIG. 3.
Figure 4B:
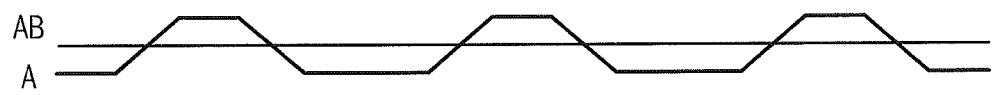

FIGS. 4A and 4B are diagrams of first and second input signals which are inputted to the signal input circuit of FIG. 3.

Referring to FIG. 4A, in the differential mode, the first and second input signals A and AB are inverted therebetween, that is, they are inverted versions of each other. The differential amplifier 310 amplifies a difference between the first and second input signals A and AB to output the first output signal OUT1.

Referring to FIG. 4B, in the pseudo differential mode, the second input signals AB is a level of a reference signal. The differential amplifier 310 amplifies the difference between the first and second input signals A and AB to output the second output signal OUT2.

Therefore, when the mode selection signal C has a first level, the signal input circuit 300 of FIG. 3 operates as a pseudo differential input circuit or a differential input circuit that amplifies the difference between the first and second input signals A and AB to output the output signal Y. When the mode selection signal C has a second level, the signal input circuit 300 may operate as a single input circuit that inverts only the first input signal A to output the inverted signal.

According to the signal input circuit 300 of FIG. 3, however, an operation speed becomes slower and a circuit area increases because of the multiplexer 330. Moreover, power consumption increases because the differential amplifier 310 and the inverter 320 always are in respective operation states, irrespective of an operation mode.

Figure 5:
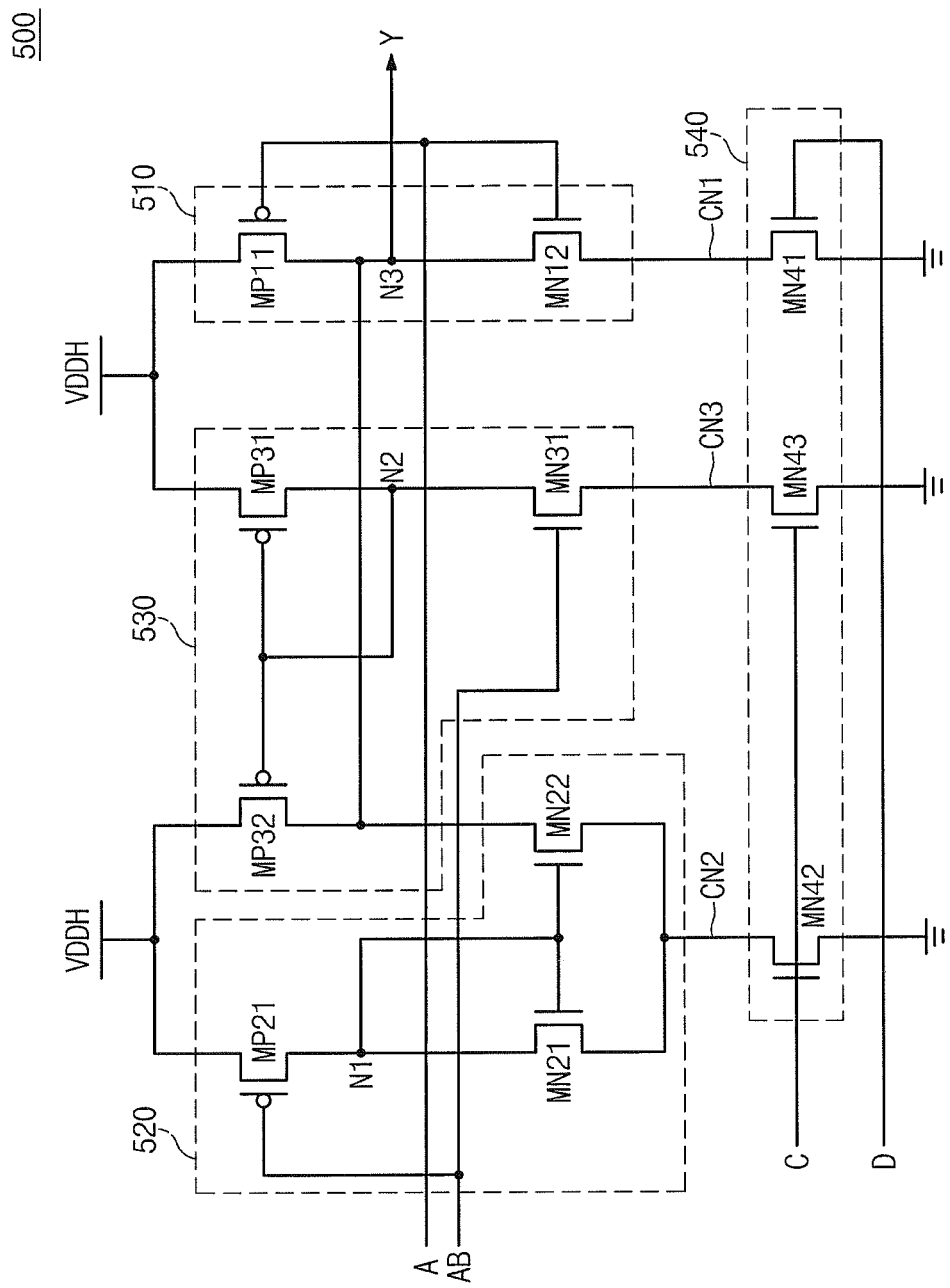
FIG. 5 is a diagram illustrating a signal input circuit according to another embodiment of the inventive concept.

FIG. 5 is a diagram illustrating a signal input circuit according to another embodiment of the inventive concept.

Referring to FIG. 5, a signal input circuit 500 according to another embodiment of the inventive concept includes an input unit 510, a first compensation circuit 520, a second compensation circuit 530, and an enable circuit 540. The input unit 510 includes a PMOS transistor MP11 and an NMOS transistor MN12. The PMOS transistor MP11 and the NMOS transistor MN12 are sequentially connected in series between a power source voltage VDDH terminal and a first connection node CN1. The first connection node CN1 is a node for connecting the input unit 510 and the enable circuit 540. The gate of the PMOS transistor MP11 and the gate of the NMOS transistor MN12 receive a first input signal A. The signal of an output node N3, being a connection node between the PMOS transistor MP11 and the NMOS transistor MN12, is outputted as an output signal Y.

The first compensation circuit 520 includes a PMOS transistor MP21 and NMOS transistors MN21 and MN22. The PMOS transistor MP21 and the NMOS transistor MN21 are sequentially connected in series between the power source voltage VDDH terminal and a second connection node CN2. The second connection node CN2 is a node for connecting the first compensation circuit 520 and the enable circuit 540. The gate of the PMOS transistor MP21 receives a second input signal AB, and the gate of the NMOS transistor MN21 is connected to a first node N1 being a connection node between the PMOS transistor MP21 and the NMOS transistor MN21. The NMOS transistor MN22 is connected between the output node N3 and a second connection node CN2, and its gate is connected to the first node N1.

The second compensation circuit 530 includes PMOS transistors MP31 and MP32 and an NMOS transistor MN31. The PMOS transistor MP32 and the NMOS transistor MN31 are sequentially connected in series between the power source voltage VDDH terminal and a third connection node CN3. The third connection node CN3 is a node for connecting the second compensation circuit 530 and the enable circuit 540. The gate of the PMOS transistor MP31 is connected to a second node N2 being a connection node between the PMOS transistor MP32 and the NMOS transistor MN31. The gate of the NMOS transistor MN31 receives the second input signal AB. The PMOS transistor MP31 is connected between the power source voltage VDDH terminal and the output node N3, and its gate is connected to the second node N2.

The enable circuit 540 includes NMOS transistors MN41 to MN43. The NMOS transistor MN41 is connected between the first connection node CN1 and a ground voltage terminal, and is controlled by a second mode selection signal D. The NMOS transistor MN42 is connected between the second connection node CN2 and the ground voltage terminal, and is controlled by a first mode selection signal C. The NMOS transistor MN43 is connected between the third connection node CN3 and the ground voltage terminal, and is controlled by the first mode selection signal C.

The operation of the signal input circuit 500 having the above-described configuration is as follows.

When the second mode selection signal D has a high level, the NMOS transistor MN41 is turned on. When the NMOS transistor MN41 is in a turn-on state, the input unit 510 receives the first input signal A to output the output signal Y. At this point, the output signal Y is the inversion signal of the first input signal A. When the first mode selection signal has a low level and the second mode selection signal D has a high level, the signal input circuit 500 operates in the single input mode.

When all the first and second mode selection signals C and D have a high level, all the NMOS transistors MN41 to NM43 of the enable circuit 540 are turned on, and thus the input unit 510 and the first and second compensation circuits 520 and 530 are in respective operation states.

When the voltage level of the first input signal A is lower than the voltage level of the second input signal AB, the PMOS transistor MP11 of the input unit 510 is turned on, and the NMOS transistor MN12 is turned off. At this point, the amount of a current, which flows through the NMOS transistor MN31 and the NMOS transistor MN22, is determined according to the voltage level of the second input signal AB. Therefore, the signal input circuit 500 outputs the output signal Y corresponding to a voltage difference between the first input signal A and the second input signal AB. That is, when all the first and second mode selection signals C and D have a high level, the signal input circuit 500 operates in one of the differential mode and the pseudo differential mode according to the first and second input signals A and AB.

An error may occur in the length and width of a channel due to a transistor fabricating process. The response time of a transistor is determined according to the length and width of the channel. Moreover, the response time of the transistor is changed according to an ambient environment. When the characteristic of the PMOS transistor MP11 and the characteristic of the NMOS transistor MN12 are identically changed, i.e., when all the response time of the PMOS transistor MP11 and the response time of the NMOS transistor MN12 become slower or faster, this does not greatly affect the operation characteristic of the signal input circuit 500. However, when the response time of one of the PMOS transistor MP11 and the NMOS transistor MN12 becomes slower and another response time becomes faster, the output signal Y that is outputted from the signal input circuit 500 has a hysteresis characteristic. The signal input circuit 500 according to another embodiment of the inventive concept includes a first compensation circuit 520 and a second compensation circuit 530, wherein when the response time of the PMOS transistor MP11 differs from the response time of the NMOS transistor MN12 because of factors such as processes and an ambient environment, the first compensation circuit 520 and the second compensation circuit 530 can compensate for the different response times.

The operation of the signal input circuit 500 will be described hereinafter for the case in which the first input signal A and the second input signal AB have a complementary voltage level, i.e., in the differential mode. When the first input signal A is shifted from a low level to a high level, the PMOS transistor MP11 is turned off, and the NMOS transistor MN12 is turned on. At this point, when the response time of the PMOS transistor MP11 is slow and the response time of the NMOS transistor MN12 is fast, a speed in which the output signal Y is shifted from a high level to a low level is delayed. The PMOS transistor MP21 of the first compensation circuit 520 is turned on in response to the second input signal AB that has been shifted from a high level to a low level, and the voltage level of the node N1 becomes higher. Accordingly, all the NMOS transistors MN21 and MN22 having respective gates connected to the node N1 are turned on. The current of the output node N3 is discharged to the ground voltage terminal through the NMOS transistor MN22 and the NMOS transistor MN42 of the enable circuit 540. The output signal Y, which is outputted through the output node N3 by the first compensation circuit 520, is quickly shifted from a high level to a low level. Therefore, the first compensation circuit 520 can compensate the response time of the PMOS transistor MP11 in the input unit 510. Since the NMOS transistor MN31 of the second compensation circuit 530 is turned off while the second input signal AB has a low level, the second compensation circuit 530 does not operate.

On the other hand, when the first input signal A is shifted from a high level to a low level, the PMOS transistor MP11 is turned on, and the NMOS transistor MN12 is turned off. At this point, when the response time of the PMOS transistor MP11 is fast and the response time of the NMOS transistor MN12 is slow, a speed in which the output signal Y is shifted from a low level to a high level is delayed. The PMOS transistor MP31 of the second compensation circuit 530 is turned on in response to the second input signal AB that has been shifted from a low level to a high level. Accordingly, the current of the second node N2 is discharged to the ground voltage terminal through the NMOS transistor MN31 and the NMOS transistor MN43 of the enable circuit 540. All the PMOS transistors MP31 and MP32 are turned on. Since a current is supplied to the output node N3 through the PMOS transistor MP31, the output signal Y that is outputted through the output node N3 is quickly shifted from a low level to a high level. Therefore, the second compensation circuit 530 can compensate the response time of the NMOS transistor MN12 in the input unit 510. Since the PMOS transistor MP21 of the first compensation circuit 520 is turned off while the second input signal AB has a high level, the first compensation circuit 520 does not operate.

The NMOS transistors MN42 and MN43 of the enable circuit 540 in the signal input circuit 500 of FIG. 5 are turned on in response to the first mode selection signal C. Therefore, when the signal input circuit 500 operates in the single input mode, unnecessary power consumption of the first and second compensation circuits 520 and 530 can be prevented.

Unlike the signal input circuit 300 of FIG. 3, since the signal input circuit 500 of FIG. 5 does not require a bias circuit, the power consumption of the signal input circuit 500 is reduced relative to the signal input circuit 300 of FIG. 3. In the signal input circuit 500 including no bias circuit, skew between the differential input mode and the single input mode and between the pseudo differential input mode and the single input mode is minimized, and the signal input circuit 500 may operate in a wide voltage range. Unlike the signal input circuit 300 of FIG. 3, since the signal input circuit 500 of FIG. 5 does not include a multiplexer, the operation speed of the signal input circuit 500 increases.

Figure 6A:
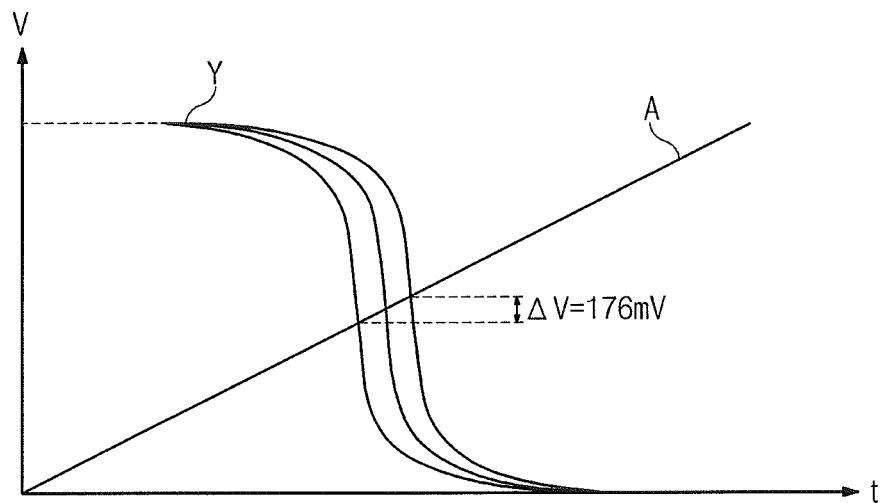
FIGS. 6A and 6B are diagrams illustrating the shift of an output signal in accordance with an input signal when the response times of the PMOS transistor and NMOS transistor of an input unit in FIG. 5 differ from each other due to an error in a semiconductor fabricating process.
Figure 6B:
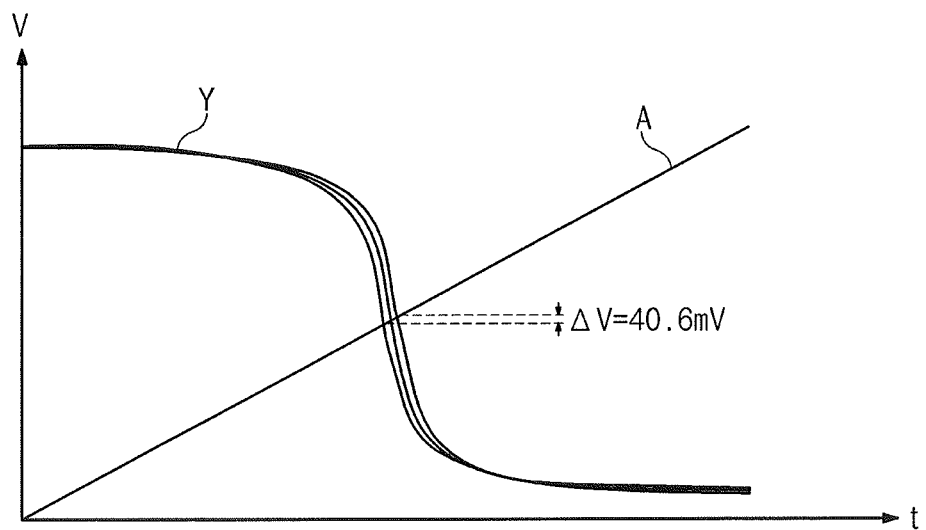

FIGS. 6A and 6B are diagrams illustrating the shift of the output signal in accordance with the input signal when the response times of the PMOS transistor and NMOS transistor of the input unit in FIG. 5 differ from each other due to an error or variation in a semiconductor fabricating process.

FIG. 6A is a diagram illustrating the shift of the output signal Y in accordance with the input signal A of the signal input circuit 300 in FIG. 3. FIG. 6B is a diagram illustrating the shift of the output signal Y in accordance with the input signal A of the signal input circuit 500 in FIG. 5. As seen through the comparison of FIGS. 6A and 6B, the shift voltage difference of the signal input circuit 300 in FIG. 3 is a maximum of 176 mV, and the shift voltage difference of the signal input circuit 500 in FIG. 5 is a maximum of 40.6 mV. The first and second compensation circuits 520 and 530 in the signal input circuit 500 can compensate for a response time difference between the PMOS transistor MP11 and the NMOS transistor MN12 that is caused by a process. That is, a difference between the shift time of the output signal Y when the input signal A is shifted from a low level to a high level and the shift time of the output signal Y when the input signal A is shifted from a high level to a low level is smaller in the signal input circuit 500 of FIG. 5.

Figure 7A:
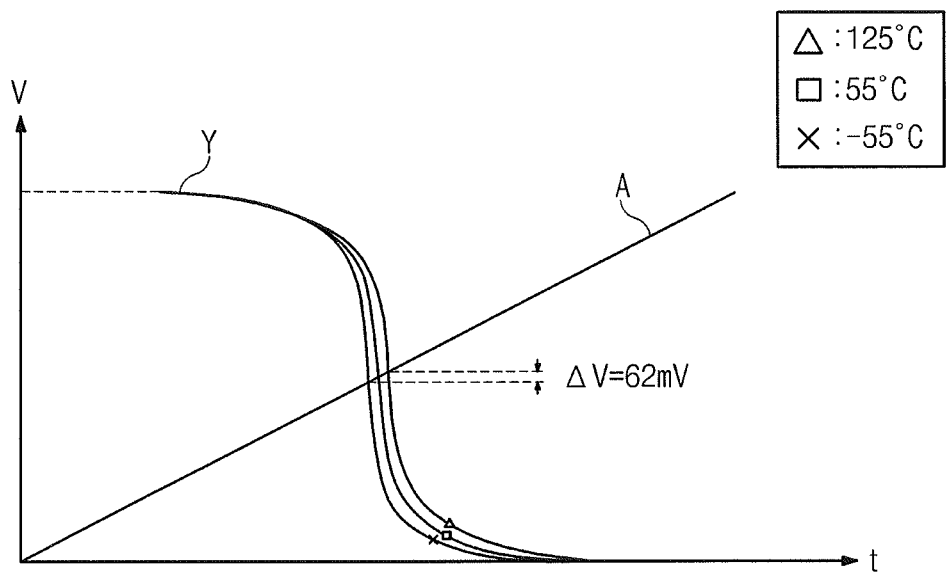
FIGS. 7A and 7B are diagrams illustrating the shift of the output signal in accordance with the input signal when the response times of the PMOS transistor and NMOS transistor of the input unit in FIG. 5 differ from each other due to an ambient environment.
Figure 7B:
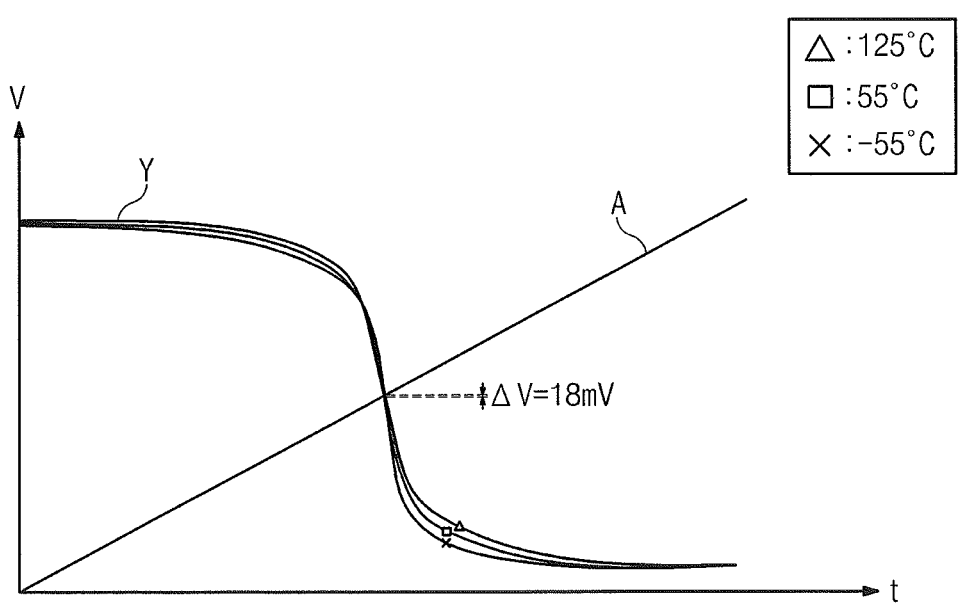

FIGS. 7A and 7B are diagrams illustrating the shift of the output signal in accordance with the input signal when the response times of the PMOS transistor and NMOS transistor of the input unit in FIG. 5 differ from each other due to differences in an ambient environment. In the case of an ambient environment of 125° C. and the case of an ambient environment of −50° C., the shift voltage difference of the signal input circuit 300 in FIG. 3 is a maximum of 62 mV, and the shift voltage difference of the signal input circuit 500 in FIG. 5 is a maximum of 18 mV. The first and second compensation circuits 520 and 530 in the signal input circuit 500 can compensate for a response time difference between the PMOS transistor MP11 and the NMOS transistor MN12 that is caused by an ambient environment.

According to embodiments of the inventive concept, implemented is the signal input circuit that has a simple circuit configuration and can receive the differential signal and the single signal. Furthermore, the performance of the signal input circuit can be prevented from being degraded because of processes or an ambient environment.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A signal input circuit, comprising:
    an input unit comprising a plurality of transistors and configured to receive a first input signal to output an output signal to an output node;
    a first compensation circuit connected to the output node, and configured to discharge the output node in response to a second input signal;
    a second compensation circuit connected to the output node, and configured to supply a current to the output node in response to the second input signal; and
    an enable circuit coupled between a ground voltage and each the input unit and the first and second compensation circuits and configured to enable the input unit and the first and second compensation circuits,
    wherein in a differential mode, the first and second compensation circuits are responsive to state changes in the second input signal to selectively discharge the output node or supply the current to the output node to compensate for differences in response times of the transistors of the input unit and reduce a shift difference of the output signal.

2. The signal input circuit of claim 1, wherein the input unit comprises:
    a PMOS transistor connected between a power source voltage terminal and the output node, and controlled by the first input signal; and
    an NMOS transistor connected between the output node and the enable circuit, and controlled by the first input signal.

3. The signal input circuit of claim 1, wherein the first compensation circuit comprises:
    a PMOS transistor connected between a power source voltage terminal and a first node, and controlled by the second input signal;
    a first NMOS transistor connected between the first node and the enable circuit, and controlled by a signal of the first node; and a second NMOS transistor connected between the output node and the enable circuit, and controlled by the signal of the first node.

4. The signal input circuit of claim 1, wherein the second compensation circuit comprises:
   a first PMOS transistor connected between a power source voltage terminal and the output node, and controlled by a signal of a second node;
   a second PMOS transistor connected between the power source voltage terminal and the second node, and controlled by the signal of the second node; and
   an NMOS transistor connected between the second node and the enable circuit, and controlled by the second input signal.

5. The signal input circuit of claim 1, wherein the first and second input signals are inverted therebetween.

6. The signal input circuit of claim 1, wherein:
   the enable circuit receives first and second operation mode selection signals,
   the enable circuit enables the first and second compensation circuits in response to the first operation mode selection signal, and
   the enable circuit enables the input unit in response to the second operation mode selection signal.

7. A signal input circuit, comprising:
   an input unit comprising a plurality of transistors and configured to receive a first input signal to output an output signal to an output node;
   a first compensation circuit connected to the output node, discharging the output node in response to a second input signal;
   a second compensation circuit connected to the output node, supplying a current to the output node in response to the second input signal; and
   a switching circuit respectively connected between each of the input unit, the first compensation circuit and the second compensation circuit through first to third connection nodes, configured to connect the first to third connection nodes to a ground voltage terminal to compensate for changes in response times of the transistors of the input unit in response to at least one operation mode selection signal,
   wherein in a differential mode, the first and second compensation circuits are responsive to state changes in the second input signal to selectively discharge the output node or supply the current to the output node to compensate for differences in response times of the transistors of the input unit and reduce a shift difference of the output signal.

8. The signal input circuit of claim 7, wherein the input unit comprises:
   a PMOS transistor connected between a power source voltage terminal and the output node, and controlled by the first input signal; and
   an NMOS transistor connected between the output node and the switching circuit, and controlled by the first input signal.

9. The signal input circuit of claim 7, wherein the first compensation circuit comprises:
   a PMOS transistor connected between a power source voltage terminal and a first node, and controlled by the second input signal;
   a first NMOS transistor connected between the first node and the first connection node of the switching circuit, and controlled by a signal of the first node; and
   a second NMOS transistor connected between the output node and the first connection node of the switching circuit, and controlled by the signal of the first node.

10. The signal input circuit of claim 7, wherein the second compensation circuit comprises:
    a first PMOS transistor connected between a power source voltage terminal and the output node, and controlled by a signal of the second node;
    a second PMOS transistor connected between the power source voltage terminal and the second node, and controlled by the signal of the second node; and
    an NMOS transistor connected between the second node and the second connection node of the switching circuit, and controlled by the second input signal.

11. The signal input circuit of claim 7, wherein the first and second input signals are inverted therebetween.

12. The signal input circuit of claim 11, wherein the switching circuit receives first and second operation mode selection signals, connects the second and third connection nodes which are respectively connected to the first and second compensation circuits to the ground voltage terminal, and connects the first connection node connected to the input unit to the ground voltage terminal in response to the second operation mode selection signal.

13. The signal input circuit of claim 12, wherein the switching circuit comprises:
    a first NMOS transistor connected between the ground voltage terminal and the first connection node which is connected to the input unit, and controlled by the first operation mode selection signal;
    a second NMOS transistor connected between the ground voltage terminal and the second connection node which is connected to the first compensation circuit, and controlled by the second operation mode selection signal; and
    a third NMOS transistor connected between the ground voltage terminal and the third connection node which is connected to the second compensation circuit, and controlled by the second operation mode selection signal.

14. A signal input circuit, comprising:
    a PMOS transistor connected between a power source voltage terminal and an output node, and controlled by a first input signal;
    an NMOS transistor connected between the output node and a switching circuit, and controlled by the first input signal;
    a first compensation circuit connected to the output node, compensating an operation delay of the PMOS transistor in response to a second input signal;
    a second compensation circuit connected to the output node, compensating an operation delay of the NMOS transistor in response to the second input signal; and
    an enable circuit enabling the PMOS transistor, the NMOS transistor and the first and second compensation circuits in response to at least one operation mode selection signal.

15. The signal input circuit of claim 14, wherein the first and second input signals are inverted therebetween.

16. The signal input circuit of claim 14, wherein:
    the first compensation circuit discharges the output node when the second input signal has a first level, and
    the second compensation circuit supplies a current to the output node when the second input signal has a second level.

17. A semiconductor device, comprising:
    a first circuit; and a second circuit receiving a data signal from the first circuit, and comprising a signal input circuit for receiving the data signal from the first circuit, wherein the signal input circuit comprises:

an input unit comprising a plurality of transistors and configured to receive a first input signal to output an output signal to an output node;

a first compensation circuit connected to the output node, discharging the output node in response to a second input signal;

a second compensation circuit connected to the output node, supplying a current to the output node in response to the second input signal; and an enable circuit coupled to the input unit and the first and second compensation circuits and configured to enable the input unit and the first and second compensation circuits in response to at least one operation mode selection signal, wherein in a differential mode, the first and second compensation circuits are responsive to state changes in the second input signal to selectively discharge the output node or supply the current to the output node to compensate for differences in response times of the transistors of the input unit and reduce a shift difference of the output signal.

18. The semiconductor device of claim 17, wherein:

the first and second input signals are inverted therebetween, and the enable circuit receives first and second operation mode selection signals, enables the first and second compensation circuits in response to the first operation mode selection signal, and enables the input unit in response to the second operation mode selection signal.

19. The semiconductor device of claim 18, wherein:

the first compensation circuit comprises:

a PMOS transistor connected between a power source voltage terminal and a first node, and controlled by the second input signal;

a first NMOS transistor connected between the first node and the first connection node of the switching circuit, and controlled by a signal of the first node; and a second NMOS transistor connected between the output node and the first connection node of the switching circuit, and controlled by the signal of the first node, and the second compensation circuit comprises:

a first PMOS transistor connected between a power source voltage terminal and the output node, and controlled by a signal of the second node;

a second PMOS transistor connected between the power source voltage terminal and the second node, and controlled by the signal of the second node; and an NMOS transistor connected between the second node and the second connection node of the switching circuit, and controlled by the second input signal.

* * * * *